United States Patent [19]
Higuchi

[11] Patent Number: 5,257,139
[45] Date of Patent: Oct. 26, 1993

[54] REFLECTION REDUCTION PROJECTION OPTICAL SYSTEM

[75] Inventor: Akira Higuchi, Matsudo, Japan

[73] Assignee: Nikon Corporation, Tokyo, Japan

[21] Appl. No.: 877,422

[22] Filed: May 1, 1992

[30] Foreign Application Priority Data

May 9, 1991 [JP] Japan .................... 3-104260

[51] Int. Cl.$^5$ ............ G02B 17/06; G03B 27/53; G21K 5/00
[52] U.S. Cl. ................ 359/859; 378/34; 355/52; 355/53
[58] Field of Search .......... 359/859, 366, 729, 731; 378/34, 35; 355/52, 53

[56] References Cited

U.S. PATENT DOCUMENTS

| | | | |
|---|---|---|---|
| 3,748,015 | 7/1973 | Offner | 359/366 |
| 4,376,580 | 3/1983 | Novak et al. | 359/859 |
| 4,685,777 | 8/1987 | Hirose | 359/366 |
| 4,747,678 | 5/1988 | Shafer et al. | 350/505 |
| 5,063,586 | 11/1991 | Jewell et al. | 378/34 |
| 5,153,898 | 10/1992 | Suzuki et al. | 378/34 |

FOREIGN PATENT DOCUMENTS 63-311315 12/1988 Japan .

*Primary Examiner*—Jon W. Henry
*Attorney, Agent, or Firm*—Shapiro and Shapiro

[57] ABSTRACT

A reflection reduction optical system comprises a first convex reflective surface $R_1$, a second reflective surface $R_2$, a third convex reflective surface $R_3$, and a fourth concave reflective surface $R_4$ to reflect light rays from an object surface. The third convex reflective surface $R_3$ and the fourth concave reflective surface $R_4$ are concentrically disposed. At least one of the object surface O and an image surface I is of concave sphere with respect to the reduction projection optical system. For practical use, the object surface is formed in a concave sphere with respect to the reduction projection optical system and the image plane in a plane perpendicular to the optical axis. A mask of concave sphere, which is the object surface O, is rotated during light exposure about a center of curvature $C_0$ thereof located on the optical axis. A synchronous scan of wafer surface as being as the image surface I is carried out in a direction perpendicular to the optical axis in synchronism with the rotation of mask.

4 Claims, 3 Drawing Sheets

ASTIGMATISM

LATERAL ABERRATION

F I G. 6
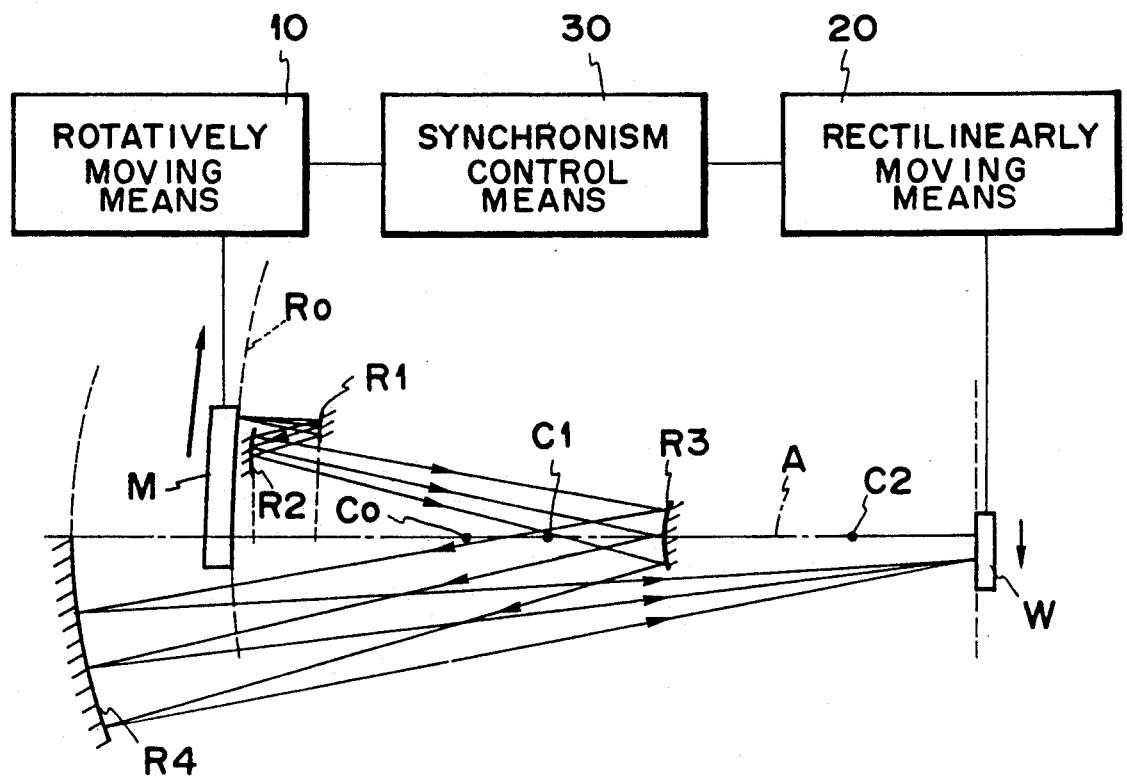

REFLECTION REDUCTION PROJECTION OPTICAL SYSTEM

BACKGROUND OF THE INVENTION

1. Field of the Invention

The present invention relates to a reflection optical system. More particularly, the invention relates to a reflection reduction projection optical system for reduction projection exposure of pattern on a mask or reticle onto a wafer with coating of photo resist thereon in a process for producing a semiconductor integrated circuit.

2. Related Background Art

Conventional light exposure apparatus for production of semiconductor element such as stepper have been using near-ultraviolet light. An excimer laser and far-ultraviolet light of shorter wavelength are also used these days. As a pattern of integrated circuit is made finer, a higher resolution is desired for light exposure apparatus.

A resolving power of optical system is determined by an exposure light wavelength and a numerical aperture of optical system. As the exposure light wavelength becomes shorter, and, as the numerical aperture becomes greater, the resolving power increases. It is, however, difficult to increase the numerical aperture in view of optical designing. Also, as the numerical aperture increases, a depth of focus becomes shallower, presenting a problem in practical use.

It has been tried to use a soft X-ray or an X-ray of further shorter wavelength as the exposure light.

There have been developed various exposure systems using the X-ray. Such exposure systems are so-called proximity type to transfer a shadow pattern of mask onto a wafer. Thus the pattern of mask itself must be formed finely, which requires severe control of processing precision. Such production of mask has been so difficult.

Then promising is a reflection reduction projection optical system for transferring a reduced mask pattern onto a wafer. Shafer et al. disclose such a reflection reduction optical system in U.S. Pat. No. 4,747,678 (corresponding to Japanese Patent Application Laid-Open No. 63-163319).

The optical system is fundamentally composed of three concave mirrors and a convex mirror. A resolving power of the optical system is insufficient for production of semiconductor element due to aberrations such as spherical aberration and coma caused by the convex mirror for reduction. Addition of refractive member is also proposed in the USP to correct the aberrations. The addition of refractive member may allow excellent imaging in a circular field of view. The refractive member, however, cannot be practically used in the region of soft X-ray or of X-ray.

Another reflection reduction optical system is proposed in Japanese Patent Application Laid-open No. 63-311315, which employs an aspherical mirror for aberration correction, making the production of optical system extremely difficult.

Although the reflection reduction optical system, which can perform synchronous scan of mask and wafer at a ratio of magnification of optical system using a circular field of view, is advantageous to obtain a wide light exposure field, it has such a problem that distortion of optical system affects imaging.

SUMMARY OF THE INVENTION

It is an object of the present invention to provide a reduction projection optical apparatus, applicable for light exposure in the regions of soft X-ray and X-ray, enabling reduction projection without difficulty in production of mask, and obtaining excellent imaging with use of spherical mirrors easy to be produced.

It is a further object of the present invention to provide a synchronous scan type reduction projection optical system which can properly correct distortion with use of spherical mirrors even upon synchronous scan of mask and wafer at a ratio of magnification of optical system.

In the reflection reduction optical apparatus according to the present invention, a reflection reduction optical system comprises a first convex reflective surface $R_1$, a second reflective surface $R_2$, a third convex reflective surface $R_3$, and a fourth concave reflective surface $R_4$ to reflect an light rays from an object surface. The third convex reflective surface $R_3$ and the fourth concave reflective surface $R_4$ are concentrically disposed. At least one of the object surface O and an image surface I is of concave sphere with respect to the reduction projection optical system. It is preferable that the object surface is formed in a concave sphere with respect to the reduction projection optical system and the image plane in a plane perpendicular to the optical axis, for practical use.

It is desirable that a mask of concave sphere, which is the object surface O, is rotated during light exposure about a center of curvature $C_0$ thereof located on the optical axis. A synchronous scan of wafer surface as being as the image surface I is carried out in a direction perpendicular to the optical axis in synchronism with the rotation of mask. In this case, it is necessary that a ratio of movement amount of wafer surface to movement amount of mask moving along the spherical surface is equal to a paraxial magnification of optical system. According to the present invention as described, the reduction projection exposure becomes possible in the regions of soft X-ray and X-ray, because the reduction projection optical system can be constituted only by the reflection system. Further, the distortion, which can be a problem in the synchronous scan type reflection optical system, may be properly corrected even in the arrangement only of spherical reflection surfaces easy to be produced, to form a reduced image with an excellent resolving power. Therefore, the apparatus according to the present invention is extremely useful as practical optical device for semiconductor element production with an ultra fine pattern such as very-large-scale integrated circuit (VLSI).

BRIEF DESCRIPTION OF THE DRAWINGS

FIG. 6 is a drawing to show a schematic structure of exposure system according to the present invention.

DETAILED DESCRIPTION OF THE PREFERRED EMBODIMENTS

Figure 1:
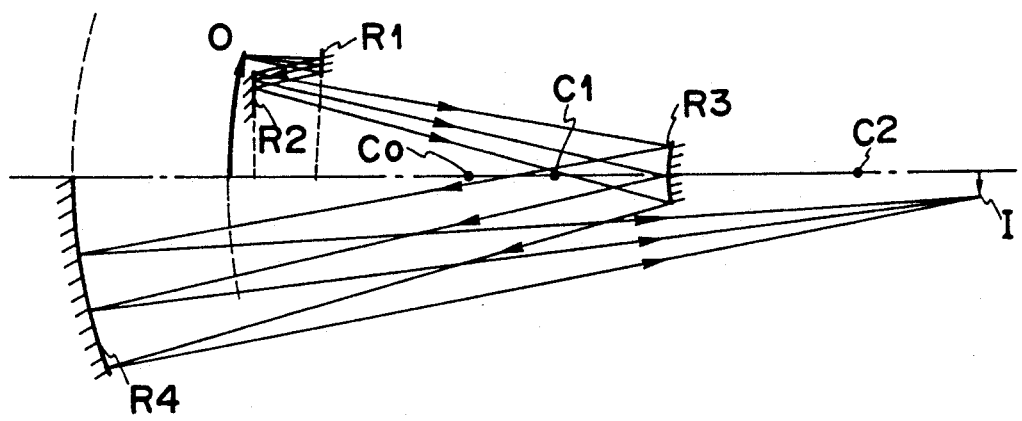
FIG. 1 is a drawing of schematic optical path to show a structure of reflection reduction optical system according to the present invention.

A reduction ratio of reflection reduction optical system according to the present invention is mainly determined by a third reflective surface $R_3$ and a fourth reflective surface $R_4$, not relating to a first reflective surface $R_1$ and a second reflective surface $R_2$ disposed proximate to an object surface O. The third reflective surface $R_3$ and the fourth reflective surface $R_4$ are concentrically disposed with the center at point $C_2$, constituting a reduction optical system of so-called Schwarzschild.

The Schwarzschild reduction optical system is an excellent optical system, enabling elimination of a spherical aberration, a coma, and an astigmatic difference in a tertiary aberration region. However, there still remains a curvature of the field and a distortion, which may be corrected as follows in the present invention.

First described is the correction of curvature of the field.

According to the tertiary aberration theory, a curvature of sagittal surface is given by a Petzval sum in an optical system without the astigmatic difference. In the reflection reduction optical system according to the present invention, the object surface or an image surface is curved with a curvature equivalent to a Petzval curvature of optical system to eliminate the curvature of the field in the tertiary aberration region. Both the object surface and the image surface may be curved to correct the curvature of the field in combination.

It is advantageous from the view of practical use to make either the object surface or the image surface curved. First explanation regards to an example of curved object surface.

A radius of curvature $R_0$ of the object surface is determined by a value corresponding to a Petzval surface determined by the Petzval sum of optical system. The Petzval sum P is summation of inverses of respective products of focal length and index of refraction. If a radius of curvature of each reflective surface is represented by $R_i$ and indices of refraction before and after reflection by $N_i$ and $N_i'$, respectively, the Petzval sum P is given by the following equation.

$$P = \sum_i (N_i' - N_i)/(R_i \cdot N_i' \cdot N_i)$$

The second reflective surface $R_2$ is inserted into the optical path proximate to the mask with the curved pattern surface to prevent the light rays from the first reflective surface $R_1$ from being interrupted by the mask. The second reflective surface $R_2$ is meaningless for correction of aberration as far as it is a planar mirror. Accordingly, the second reflective surface $R_2$ may be disposed at an arbitrary position and at an arbitrary angle as far as the light rays from the object surface O can reach the third reflective surface $R_3$ without interruption after reflected by the first reflective surface $R_1$.

Then, when the second reflective surface is a planar mirror for simply bending the optical path, only the first, the third, and the fourth reflective surfaces have substantial powers. The radius of curvature $R_0$ of the object surface is given by the following equation.

$$\frac{1}{R_0} = \left[\frac{N_1' - N_1}{R_1 N_1' N_1}\right] + \left[\frac{N_3' - N_3}{R_3 N_3' N_3}\right] + \left[\frac{N_4' - N_4}{R_4 N_4' N_4}\right] \quad (1)$$

In the equation (1), $R_0$ is positive when the object surface is curved in a concave shape with respect to the optical system. Signs for respective symbols will be later defined in explanation of embodiments.

Next explained is the correction of distortion.

If the third reflective surface $R_3$ is an aperture-stop in the Schwarzschild reduction optical system composed of the third reflective surface $R_3$ and the fourth reflective surface $R_4$, a negative distortion is generated by the fourth reflective surface $R_4$ of concave mirror. A distortion factor V is a positive value.

According to the tertiary aberration theory, a distortion factor $V'$ for curved object surface is given by the following equation.

$$V' = V - \alpha'/(\alpha N R_0) \quad (2)$$

In the equation (2), V represents the distortion factor for planar object surface and N an index of refraction of object space. Further, $\alpha, \alpha'$ represent reduced inclination angles of paraxial rays and pupil-paraxial rays, respectively, in the object space, both having negative values.

If the object surface is curved in a concave sphere with respect to the optical system to correct the curvature of the field as described above ($R_0 > 0$), the distortion factor $V'$ for curved object surface obtained from the equation (2) is made smaller, improving the negative distortion. Actually, since the value obtained from the equation (2) is slightly negative, a slight positive distortion remains.

The reflection reduction optical system of the present invention has the reflective mirror $R_1$ proximate to the object surface to eliminate the distortion.

The distortion D (%) is given by the following equation.

$$D = 100(y' - y)/y \quad (3)$$

In the equation (3), $y'$ represents a height of chief ray on a Gauss image surface and y an ideal image height. The ideal image height is not defined in general for curved object surface.

Figure 2:
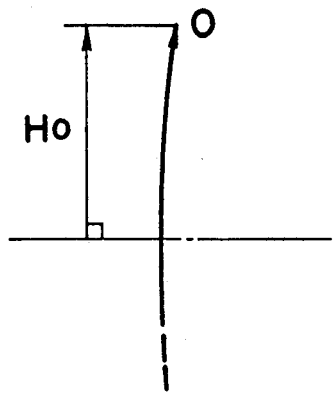
FIG. 2 is a drawing to illustrate a height of object.
Figure 3:
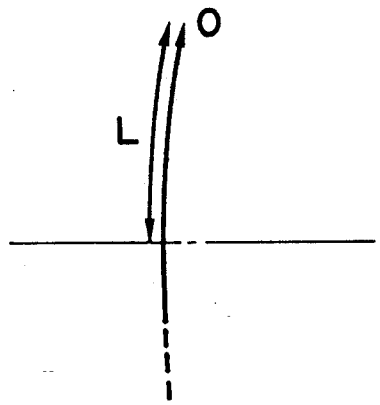
FIG. 3 is a drawing to illustrate a height of object in the present invention.

First trial of ideal image height is shown in FIG. 2. As shown in FIG. 2, the curved object surface is projected onto a flat surface perpendicular to the optical axis and a height from the optical axis is taken as the object height $H_0$. Then the ideal image height is defined by the following equation.

$$y = H_0 \times \beta \quad (4)$$

In the equation (4), $\beta$ represents an imaging magnification of reduction projection optical system.

Since a remaining distortion is positive, the first reflective surface $R_1$ should have a positive power or be a concave mirror to correct the distortion.

However, since the projection plane is connected to the image surface by the paraxial magnification, a shift correction is required for the pattern dimensions on the concave mask by dimensions determined by the paraxial magnification to obtain the pattern with dimensions on the image surface. A correction amount differs depending on a position in the circular field of view rectilinearly scanned in a predetermined direction upon light exposure, making complex the dimension control of pattern on the convex mask and making the production of mask difficult.

In the present invention to solve the above problem, the object height is represented by a distance L taken along the concave sphere of mask from the optical axis, and the ideal image height y is redefined by the following equation.

$$y = L \times \beta \qquad (5)$$

Since y is made larger, a negative distortion is obtained The first reflective surface $R_1$ is given a negative power or is made as convex mirror in order to correct the distortion.

In summary, the distortion is defined using the object height of distance L taken along the concave sphere of mask from the optical axis, and the distortion is corrected by using the first reflective surface $R_1$ of convex mirror, so that the dimensions of projected pattern on the image surface accurately correspond at paraxial magnification of optical system to the actual dimensions of pattern on the concave mask.

The above example concerns the case that the object surface O is of concave sphere in the arrangement of the present invention. It is also possible that the image surface I is formed in a concave sphere. In that case, a radius of curvature $R_I$ of image surface is given by a Petzval sum in the following similarly as the above-described equation (2).

$$\frac{1}{R_I} = -\left[\frac{N_1' - N_1}{R_1 N_1' N_1}\right] - \left[\frac{N_3' - N_3}{R_3 N_3' N_3}\right] - \left[\frac{N_4' - N_4}{R_4 N_4' N_4}\right]$$

$R_I$ is negative when the concave image surface faces the optical system.

A height of image is represented by a distance along the concave sphere of image surface from the optical axis and an ideal image height L' is defined by the following equation.

$$L' = H_0 \times \beta.$$

Then the dimensions of projected pattern on the image surface of concave sphere accurately correspond at the paraxial magnification of optical system to the actual dimensions of pattern on the planar mask.

An embodiment as shown in FIG. 1 is an example to show a principle structure, in which the object surface O concave, the image surface I is planar, and the second reflective surface is planar. FIG. 1 shows a schematic structure of reflection reduction optical apparatus according to the present invention. In the apparatus, light rays from the concave object surface O is reflected by the first convex reflective surface $R_1$, further reflected by the second planar reflective surface $R_2$, again reflected by the third convex reflective surface $R_3$, and then reflected by the fourth concave reflective surface $R_4$ to image a pattern of object surface O on the planar image surface I after reduction. The optical axis of optical system is defined as a straight line connecting between centers of curvature of reflective surfaces, on which a curvature center $C_0$ of object surface O of concave sphere, a curvature center $C_1$ of first reflective surface $R_1$, and a common curvature center $C_2$ of third reflective surface $R_3$ and fourth reflective surface $R_4$ are located.

Specifications of the present embodiment are as follows, which present extremely excellent imaging in the circular region about the optical axis.
Magnification: $\beta = -1/5.7$;
Numerical aperture: NA = 0.025;
Dimensions of light
 exposure area: radius of circle: 20.0 mm; width of slit: 0.30 mm;
 Resolving power: 0.24 μm for wavelength of 10 nm; 0.12 μm for wavelength of 5 nm.

There are listed in Table 1 specific numerical values in the arrangement of the present embodiment. Table 1 shows the radius of curvature, the interplanar spacing, and the index of refraction of each curved surface in an order from the object surface O to the image surface I.

In the arrangement as shown in FIG. 1, a ray is positive when it proceeds from left to right, a radius of curvature of curved surface is positive when a convex surface directs to the left, a radius of curvature of curved surface is negative when a concave surface directs to the left, and an interplanar spacing is positive in a medium in which a proceeding direction of ray is positive, but negative in a medium in which a proceeding direction of ray is negative. An index of refraction is positive in a medium in which a ray proceeds in the positive direction, but negative in a medium in which a ray proceeds in the negative direction.

TABLE 1

| | Radius of curvature (object surface) | Inter planar spacing | Index of refraction |
|---|---|---|---|
| $r_0$ | 287.000 | 100.000 | 1.00 |
| $r_1$ | 1455.000 | −80.000 | −1.00 |
| $r_2$ | .000 | 1882.000 | 1.00 |
| $r_3$ | 687.333 | −2060.000 | −1.00 |
| $r_4$ | 2747.333 | 3297.819 | 1.00 |

In the above embodiment, the radius of curvature of the object surface is $r_0 = 287.00$, which is slightly different from the value $R_0 = 281.18$ obtained from the equation (1). This is because the higher order aberrations are taken into consideration.

Figure 4:
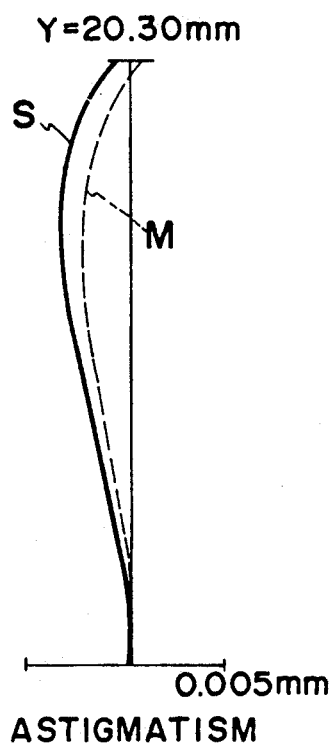
FIG. 4 is a drawing of astigmatism in an embodiment according to the present invention.
Figure 5:
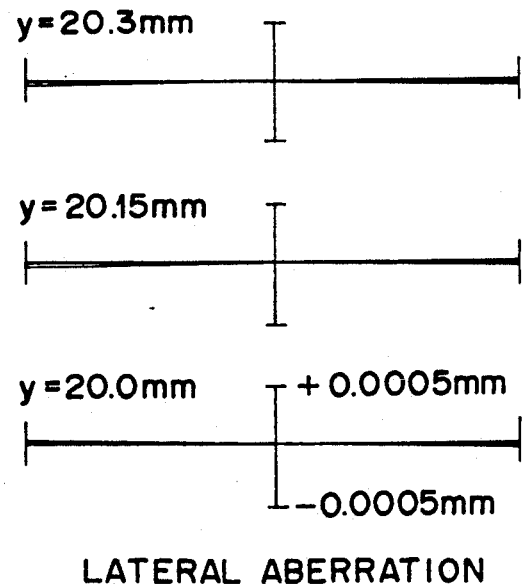
FIG. 5 shows drawings of lateral aberration in the embodiment according to the present invention.

Regarding the above embodiment, the astigmatic difference is shown in FIG. 4, the distortions defined by the equations (3), (5) in Table 2, and lateral aberrations in FIG. 5.

In FIG. 4, a broken line M shows an image surface of meridional ray, and a solid line S an image surface of sagittal ray. FIG. 5 shows lateral aberrations at y = 20.3 mm, y = 20.15 mm, and y = 20.0 mm of image height, in which solid lines show meridional rays, and broken lines sagittal rays.

TABLE 2

| Height of image (mm) | Distortion (%) |
|---|---|
| 20.30 | 0.00049 |
| 20.15 | 0.00055 |
| 20.00 | 0.00065 |

As seen from the aberrations of FIGS. 4 and 5, and from Table 2, the reflection reduction optical system of the present embodiment performs extremely excellent imaging.

If the embodiment of the present invention as described above is expected to apply for a light exposure system, a surface of mask with a predetermined pattern is curved to fit the object surface O of concave sphere, and light exposure is effected by using only a circular region holding such excellent imaging as described. The mask is rotatively moved during the exposure about the center of curvature $C_0$ of concave spherical pattern surface, and a wafer is rectilinearly moved in a direction perpendicular to the optical axis in synchronism with the rotation of mask. A ratio of movement of wafer to the movement of mask along the concave sphere is set equal to the paraxial magnification of optical system, enabling the exposure in a wide area.

FIG. 6 shows a schematic structure of such light exposure system. A structure of reduction projection optical system is the same as that of FIG. 1.

A mask M has a pattern surface formed in a concave sphere with a radius of curvature $R_O$. The pattern on the mask pattern surface is reduced and projected on a wafer W by the reflection reduction optical system comprised of a first convex reflective surface $R_1$, a second reflective surface $R_2$, a third convex reflective surface $R_3$, and a fourth concave reflective surface $R_4$. The third convex reflective surface and the fourth concave reflective surface are concentrically disposed as described above. The mask M is rotatively moved during light exposure by a predetermined angle along the concave sphere of concave spherical pattern surface with a radius of curvature $R_0$ by means of rotatively moving means 10. Simultaneously, the wafer W is rectilinearly moved in a direction perpendicular to an optical axis A by means of rectilinearly moving means 20. Synchronism control means 30 synchronizes the rectilinear motion of wafer by the rectilinearly moving means 20 with the rotative motion of mask by the rotatively moving means 10 to control the ratio of movement of wafer W by the rectilinearly moving means 20 to the movement of mask M by the rotatively moving means 10 as to be equal to the paraxial magnification of reduction projection optical system.

The above embodiments have the principle arrangement in which the first reflective surface $R_1$, the third reflective surface $R_3$, and the fourth reflective surface $R_4$ are spherical and the second reflective surface $R_2$ is planar. The second reflective surface $R_2$ may be formed spherical to give a degree of freedom for aberration correction, so that the correction of distortion with the first reflective surface $R_1$ may be well improved with a better balance, comparing to other aberrations such as spherical aberration and coma. Arranging at least one of reflective surfaces to be aspherical, the degree of freedom for correction of aberrations may be increased, obtaining more excellent imaging.

What is claimed is:

1. A reflection reduction optical apparatus for reduction projection of predetermined pattern on an object surface, onto an image surface, comprising:

first convex, second, third convex, and fourth concave reflective surfaces to reflect light rays from said object surface;

wherein said third convex and fourth concave reflective surfaces are concentrically disposed; and wherein at least one of said object and image surfaces is of concave sphere with respect to the optical system for reduction projection.

2. An apparatus according to claim 1, wherein said object surface is of concave sphere with respect to the optical system for reduction projection, and said image surface is of flat surface perpendicular to the optical axis.

3. An apparatus according to claim 2, wherein said second reflective surface is of flat surface.

4. A reflection reduction exposure system comprising:

a mask with a pattern surface being formed in a concave sphere;

a reflection reduction optical system for reduction projection of pattern on said mask pattern surface onto a wafer, said reflection reduction optical system comprising first convex, second, third convex, and fourth concave reflective surfaces to reflect light rays from said pattern surface, said third convex and said fourth concave reflective surfaces being concentrically disposed;

rotatively moving means for rotatively moving said mask during light exposure about a center of curvature of concave spherical pattern surface;

rectilinearly moving means for rectilinearly moving said wafer in a direction perpendicular to the optical axis; and synchronism control means for synchronizing the rotational movement of mask by said rotatively moving means with the rectilinear movement of wafer by said rectilinearly moving means for such a control that a ratio of wafer movement amount by said rectilinearly moving means to an amount of mask movement by said rotatively moving means is equal to paraxial magnification of said reflection reduction optical system.

* * * * *